(12) United States Patent
Zhang et al.

(10) Patent No.: US 9,882,336 B2
(45) Date of Patent: Jan. 30, 2018

(54) OPTICAL MODULE

(71) Applicants: Hisense Broadband Multimedia Technologies Co., Ltd., Qingdao, Shandong (CN); Hisense Broadband Multimedia Technologies, Ltd., Tortola (VG)

(72) Inventors: Qiang Zhang, Qingdao (CN); Qisheng Zhao, Qingdao (CN); Shihai Yang, Qingdao (CN)

(73) Assignees: Hisense Broadband Multimedia Technologies Co., Ltd., Qingdao (CN); Hisense Broadband Multimedia Technologies, Ltd., Tortola (VG)

(*) Notice: Subject to any disclaimer, the term of this patent is extended or adjusted under 35 U.S.C. 154(b) by 0 days.

(21) Appl. No.: 15/477,920

(22) Filed: Apr. 3, 2017

(65) Prior Publication Data
US 2017/0207596 A1   Jul. 20, 2017

Related U.S. Application Data

(63) Continuation-in-part of application No. 15/087,307, filed on Mar. 31, 2016, now Pat. No. 9,653,879.

(30) Foreign Application Priority Data

Sep. 29, 2015 (CN) .......................... 2015 1 0628554

(51) Int. Cl.
H01S 3/00    (2006.01)
H01S 3/13    (2006.01)
H01S 3/139   (2006.01)

(52) U.S. Cl.
CPC .......... *H01S 3/0085* (2013.01); *H01S 3/1305* (2013.01); *H01S 3/1398* (2013.01)

(58) Field of Classification Search
CPC .... H01S 3/0085; H01S 3/1398; H01S 3/1305; H01S 5/0085; H01S 5/0265
See application file for complete search history.

(56) References Cited

U.S. PATENT DOCUMENTS

| 7,697,580 B2 | 4/2010 | Smith et al. |
| 2006/0065834 A1* | 3/2006 | Flanders ................... G01J 1/32 250/339.07 |
| 2015/0372447 A1* | 12/2015 | Song ..................... H01S 3/0057 372/21 |

* cited by examiner

*Primary Examiner* — Armando Rodriguez
(74) *Attorney, Agent, or Firm* — Brinks Gilson & Lione

(57) ABSTRACT

The disclosure provides an optical module, including a laser, the laser including a light emitting region and a modulation region, and light emitted by the light emitting region emitting toward the modulation region; a first driver circuit, the first driver circuit being connected to the light emitting region, so that the light emitting region emits light with adjusted optical power; and a second driver circuit, the second driver circuit being connected to the modulation region, so that the modulation region changes the optical power of the light emitted from the light emitting region.

12 Claims, 4 Drawing Sheets

OPTICAL MODULE

PRIORITY STATEMENT

This application is a continuation-in-part under 35 U.S.C. §120 of U.S. application Ser. No. 15/087,307, filed on Mar. 31, 2016, pending, which claims the priority benefit of Chinese Patent Application No. 201510628554.0 filed on Sep. 29, 2015, in the State Intellectual Property Office of the People's Republic of China, both of which are incorporated herein in their entireties by reference.

TECHNICAL FIELD

The disclosure relates to the field of optical communication, and in particular, to an optical module.

BACKGROUND

In an optical communication network, an optical module implements conversion of an electrical signal to an optical signal, and by controlling power supply of a laser in the optical module, the optical module controls a light-emitting state of the laser, thereby implementing loading information carried by the electrical signal to the optical signal.

However, the information loaded to the optical signal is merely a single channel of information. Transmission of the single channel of information limits the bandwidth of the optical communication.

SUMMARY

An embodiment of the disclosure provides an optical module, including a laser, the laser including a light emitting region and a modulation region, and light emitted by the light emitting region emitting toward the modulation region; a first driver circuit, the first driver circuit being connected to the light emitting region, so that the light emitting region emits light with adjustable optical power; and a second driver circuit, the second driver circuit being connected to the modulation region, so that the modulation region changes the optical power of the light emitted from the light emitting region.

BRIEF DESCRIPTION OF THE DRAWINGS

The accompanying drawings described herein are used to provide further understanding of the disclosure, constructs a part of the disclosure, and exemplary embodiments and illustrations thereof of the disclosure are used to explain the disclosure, and are not intended to form improper limitation on the disclosure.

DETAILED DESCRIPTION

Figure 1:
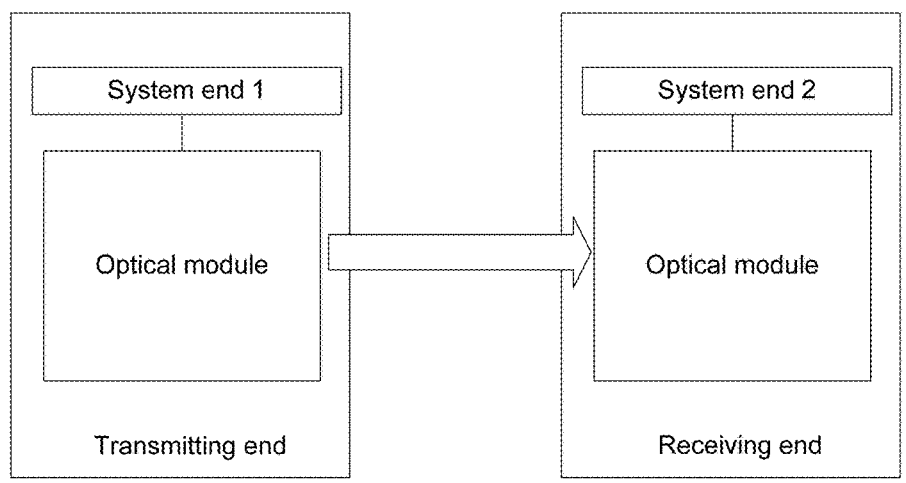
FIG. 1 is a schematic diagram of optical communication interaction in the prior art.

An optical module is an electro-optic device, and optical communication implemented by using an optical module is an interaction communication. FIG. 1 is a schematic diagram of optical communication interaction in the prior art. As shown in FIG. 1, at a transmitting end, the optical module is connected to a system end 1 (the system end is an electronic controlling device externally connected to the optical module) such as a switch, receives an electrical signal from the system end 1, converts the electrical signal into an optical signal and outputs the optical signal, and the optical signal is generally input to an optical waveguide such as an optical fiber, so as to implement information transmission. At a receiving end, an optical module is connected to a system end 2 such as a switch, receives an optical signal from the transmitting end, converts the optical signal into an electrical signal, and outputs the electrical signal to the system end 2. The system end may include an exchanger, an optical network end-member set-top box, an optical line terminal set-top box, and the like.

At the transmitting end, the optical module drives an embedded laser to emit light, thereby implementing conversion of an electrical signal into an optical signal. The system end uses an electrical signal to carry information to be transmitted, and the electrical signal is output to the optical module. The electrical signal may be a voltage signal or a current signal. The optical module drives, according to the electrical signal, the laser to emit light, so that the laser emits light whose optical power changes according to the change of the electrical signal. As such, the emitted light carries the information conveyed by the electrical signal.

Figure 2:
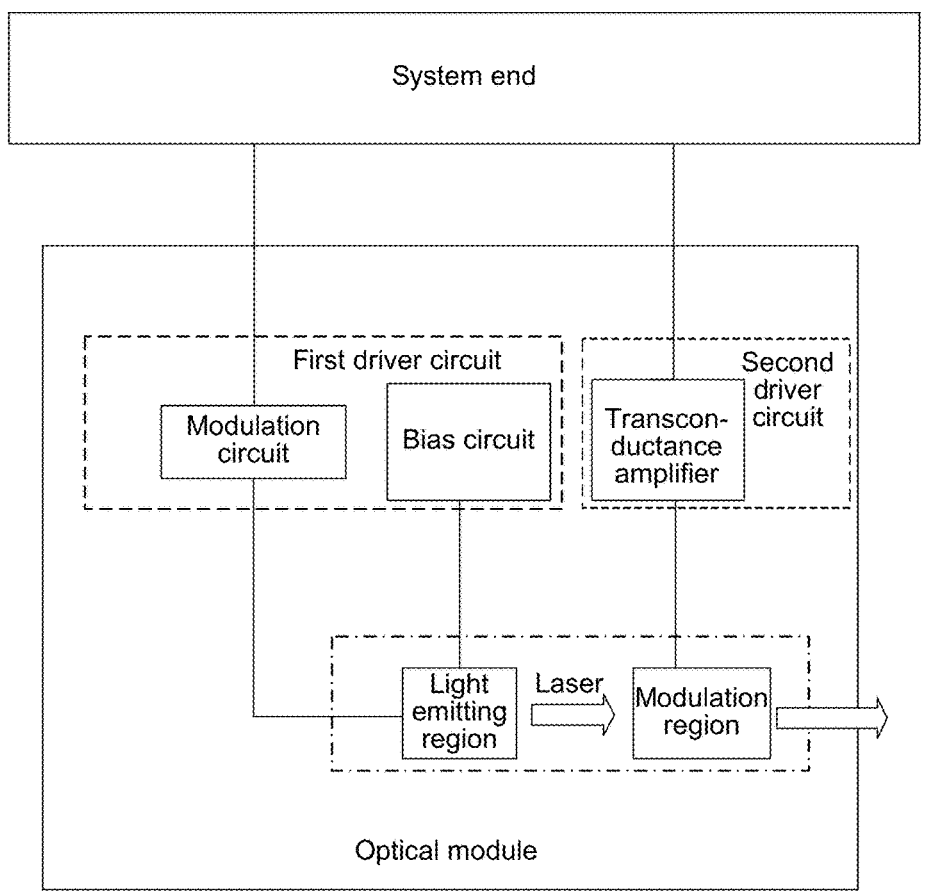
FIG. 2 is a schematic structural diagram of an optical module according to an embodiment of the disclosure.

FIG. 2 is a schematic structural diagram of an optical module according to an embodiment of the disclosure. As shown in FIG. 2, an embodiment of the disclosure provides an optical module, including a laser, a first driver circuit, and a second driver circuit.

The laser includes a light emitting region and a modulation region. Light emitted by the light emitting region travels toward the modulation region. The first driver circuit is connected to the light emitting region and drives the light emitting region to emit a light beam with adjustable optical power. By adjusting the power of the emitted light beam, the first driver circuit is able to embed first information into the emitted light beam.

The second driver circuit is connected to the modulation region. The second driver circuit may be able to control the modulation region to adjust the optical power of the emitted light beam. Accordingly, the second driver circuit is able to embed second information into the emitted light beam.

By means of the optical power changes of the light, loading information on the light may be implemented. The embodiment of the disclosure provides an optical module, the first driver circuit drives the light emitting region to emit light, so that the optical power of the light emitted by the light emitting region is adjusted, thereby implementing loading first path of information on the light. The light emitted by the light emitting region emits toward the modulation region, the second driver circuit drives the modulation region, so that the modulation region changes the optical power of the light emitted by the light emitting region, thereby implementing loading second path of information on the light.

For example, the first driving circuit may include a bias circuit and a modulation circuit: a bias circuit may be connected to the light emitting area and drives the light emitting region to emit a light beam with a stable optical power. The modulation circuit may be connected to the light emitting region, and may adjust the optical power of the emitted light beam through the light emitting region.

The optical module provided in the embodiment of the disclosure is electrically connected to an external system end. The embodiment of the disclosure provides an optical module, including a laser, the laser including a light emitting region and a modulation region, and light emitted by the light emitting region emitting toward the modulation region; a bias circuit, the bias circuit being connected to the light emitting region, and the bias circuit driving the light emitting region to emit light, where the bias circuit may drive the light emitting region so that the light emitting region emits light with stable optical power; a modulation circuit, the modulation circuit being connected to the light emitting region, and the modulation circuit driving the light emitting region, so that the optical power of the light emitted by the light emitting region changes; and a second driver circuit, the second driver circuit being connected to the modulation region, and the second driver circuit driving the modulation region, so that the modulation region changes the optical power of the light emitted from the light emitting region. One end of the modulation circuit is electrically connected to the external system end, and the other end is connected to the light emitting region.

The light emitting region of the laser may be a laser diode, the laser diode may have only one electrical input end, and the bias circuit and the modulation circuit are connected in parallel to two ends of the laser diode. The laser diode emits light under the control of the bias circuit and the modulation circuit. The bias circuit drives the light emitting region to emit the light with a stable component of the optical power. The stable component of optical power reflects the function of the bias circuit. But in practice, the light emitting region is driven by both the bias circuit and the modulation circuit. Thus the actual optical power of the emitted light is not stable.

The optical module provided in the embodiment of the disclosure further includes a laser driver chip, a laser, a first circuit, a second circuit, and a third circuit. The laser driver chip includes a bias circuit and a second driver circuit, and the second driver circuit is electrically connected to the system end.

The laser includes a light emitting region and a modulation region, and light emitted by the light emitting region emitting toward the modulation region.

The first circuit is connected to the light emitting region, providing a stable current to the light emitting region to drive the light emitting region to emit light. The first circuit may be a bias circuit, the bias circuit is connected to the light emitting region, and the bias circuit drives the light emitting region to emit light.

The second circuit is connected to the light emitting region, providing an adjustable current to the light emitting region, so as to change the optical power of the light emitted by the light emitting region. The second circuit may be a modulation circuit, the modulation circuit is connected to the light emitting region, and the modulation circuit drives the light emitting region so that the optical power of the light emitted by the light emitting region is adjusted.

The third circuit is connected to the modulation region, providing an adjustable current to the modulation region, so as to change the optical power of the light emitted from the light emitting region. The third circuit may be a second driver circuit, the second driver circuit is connected to the modulation region, and the second driver circuit drives the modulation region, so that the modulation region changes the optical power of the light emitted from the light emitting region.

The laser includes the light emitting region and the modulation region. The light emitting region may emit light with a single wavelength, the light emitted by the light emitting region emits toward the modulation region, the modulation region receives the light emitted from the light emitting region, and the modulation region changes and/or adjusts the optical power of the received light. There are multiple manners for the modulation region to change the optical power, including a distributed feedback (DFB) manner, an electrical absorption manner, a semiconductor amplification manner, and the like.

The lasers in the present disclosure may include all lasers that adopt external modulation, including, for example, EML lasers, DBR lasers, MZ lasers, and SOA lasers. A light emitting region of an EML laser is a DFB laser, and a light emitting region of a DBR laser is a DBR laser. The EML laser uses an electrical absorption semiconductor optical modulator EA as a modulation region (it is not true in the DBR, but the modulation region of a DBR+EML laser is an EA). The SOA laser uses a semiconductor laser amplifier SOA as a modulation region. The MZ (Mach-Zehnder) laser uses a Mach-Zehnder modulation arm as a modulation region.

A system end device using the optical module provided in the embodiment of the disclosure may work in a burst mode, and in this case, the laser performs modulation in a manner of amplitude modulation.

To emit light, the light emitting region requires a current with a specific value. The specific value requirement is generally referred to as a threshold current of the laser. The bias circuit provides to the light emitting region a current meeting a light emitting requirement thereof, so as to drive the light emitting region to emit light. When being driven by the bias circuit, the light emitting region emits light with stable optical power. Generally speaking, a stable current value is provided to the light emitting region, and the light emitting region can emit light with stable optical power. However, due to the characteristic of the light emitting region, for example, the threshold current of the semiconductor laser changes along with the change of the temperature, the current value provided to the light emitting region is unstable in a long time range, and the current value need to be adjusted along with the change of factors, such as the temperature of the light emitting region, in order to keep stable light emission.

The modulation circuit is connected to the light emitting region, and drives the light emitting region to adjust the optical power of the light emitted by the light emitting region. When driven alone by the bias circuit, the light emitting region emits light with stable optical power. On the basis that the bias circuit drives the light emitting region, the modulation circuit is added to drive the light emitting region, so that the optical power of the light emitted by the light emitting region is adjusted.

The modulation circuit drives the light emitting region according to a first amplitude-adjusting signal, and the first amplitude-adjusting signal comes from the system end.

The optical module, as a signal conversion device, is controlled by the system end, converts an electrical signal from the system end into an optical signal, and the electrical signal of the system end is a basis for the optical module to implement conversion.

The modulation circuit in the optical module is connected to the system end, the modulation circuit receives the first amplitude-adjusting signal from the system end, the first amplitude-adjusting signal may be a voltage signal. A piece of information may be embedded in the first amplitude-adjusting signal as changes of voltage thereof between a low level and a high level. The modulation circuit outputs a current whose magnitude change is synchronous with the change of the level. The modulation circuit generates, according to the voltage signal of the system end, a current signal output to the light emitting region. A transconductance amplifier converts the voltage signal into the current signal. The modulation circuit includes the transconductance amplifier, one end of the transconductance amplifier is connected to the system end and receives the voltage signal from the system end, and the other end of the transconductance amplifier is connected to the light emitting region and provides the current signal to the light emitting region.

The modulation circuit in the optical module is connected to the system end, the modulation circuit receives the first amplitude-adjusting signal from the system end, the first amplitude-adjusting signal may be a current signal, the current signal is an embodiment of information, amplitude change of the current signal is embodied as a change of current magnitude, and the modulation circuit amplifies the received current signal then outputs it to the light emitting region.

Driven by the bias circuit, the light emitting region emits the light with stable optical power. Then on the basis of the stable optical power, the modulation circuit loads an additional current to the stable optical power. Since the amplitude of the current changes according to the change of the voltage, the optical power of the light emitted by the light emitting region changes accordingly. The change of the optical power carries the information that the optical module delivers. When the change of the optical power corresponds to information from a single channel, the light beam carries a single channel of information.

The second driver circuit is connected to the modulation region of the laser, the second driver circuit drives the modulation region, so that the modulation region changes the optical power of the light emitted from the light emitting region.

The optical module, as a signal conversion device, is controlled by the system end, converts an electrical signal from the system end into an optical signal, and the electrical signal of the system end is a basis for the optical module to implement conversion.

The second driver circuit in the optical module is connected to the system end, the second driver circuit receives a second amplitude-adjusting signal from the system end, the second amplitude-adjusting signal may be a voltage signal carrying a second channel of information and changing between different levels, and the second driver circuit outputs a current whose magnitude change is synchronous with the change of the level. The second driver circuit generates, according to the voltage signal of the system end, a current signal output to the modulation region, and a transconductance amplifier converts the voltage signal into the current signal. The second driver circuit includes the transconductance amplifier, one end of the transconductance amplifier is connected to the system end and receives the voltage signal from the system end, and the other end of the transconductance amplifier is connected to the modulation region and provides the current signal to the modulation region.

Alternatively, the second driver circuit in the optical module is connected to the system end, the second driver circuit receives the current signal from the system end, the second amplitude-adjusting signal may be a voltage signal, the current signal carries the second channel of information through amplitude change of the current signal, and the second driver circuit amplifies the received current signal then outputs it to the modulation region.

Driven by the bias circuit, the light emitting region emits the light with stable optical power, and on this basis, the current input by the second driver circuit is loaded. Because the current magnitude changes according to the voltage signal carries the second channel of information, the optical power of the light emitted by the light emitting region changes accordingly. Therefore, the optical power of the output light beam carries the second channel of the information.

The bias circuit outputs the current signal with adjustable amplitude to the light emitting region; the modulation circuit outputs the current signal with adjustable amplitude to the light emitting region; and the second driver circuit outputs the current signal with adjustable amplitude to the modulation region. The light emitting region and the modulation region in the laser are current control devices, and currents need to be provided to drive the two regions.

The optical communication may simulate a digital signal by using the changing of the optical power, and the digital signal is generally represented in a binary manner. During implementation, high and low intensity of the optical power respectively represent "0" and "1" signals in the digital signal. The optical module may be controlled to emit light switching between the high and low intensity of optical power, which represents an order of the "0" and "1" signals. The bias circuit provides the current to the light emitting region, so as to drive the light emitting region to emit the light with stable optical power. The light with the same optical power intensity cannot represent the "0" and "1" signals in the digital signal. The modulation circuit drives the light emitting region so that the optical power of the light emitted by the light emitting region is adjusted, that is, on the basis of the bias circuit separately driving the light emitting region, the driving of the modulation circuit is added, so that the light emitting region emits light with adjustable optical power. The light with adjustable optical power intensity can represent the "0" and "1" signals in the digital signal. The second driver circuit enables the modulation region to change the optical power of the light emitted by the light emitting region, that is, the modulation region receives the light with adjustable optical power emitted by the light emitting region, and on this basis, further changes the optical power thereof, and the light with adjustable optical power intensity can represent the "0" and "1" signals in the digital signal.

The light emitted by the light emitting region emits toward the modulation region, and the light received by the modulation region is light with adjusted optical power, i.e., the light is loaded with the first channel of information. On this basis, the modulation region receives the current from the second driver circuit, and changes, under the driven of the current, the optical power of the light transmitted from the light emitting region, thereby loading a second channel of information to the light. Since the second driver circuit may operate independently from the first driver circuit, the second channel of information may be embedded into the light beam independently from the first channel of information.

Figure 3:
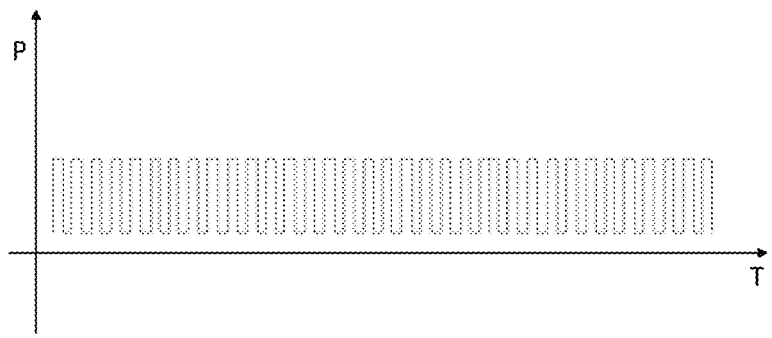
FIG. 3 is a schematic diagram of magnitude of optical power output by an optical module in the prior art.

FIG. 3 is a schematic diagram of magnitude of optical power output by an optical module in the prior art. As shown in FIG. 3, an optical module emits light with optical power adjusted with respect to time, the maximum optical power of the light is substantially consistent, and the minimum optical power of the light is substantially consistent. The optical power changes its magnitude according to a first frequency, enabling it to carry the first channel of information. An algorithm may be able to sampling the optical power according to the first frequency to extract the first channel of information.

Figure 4:
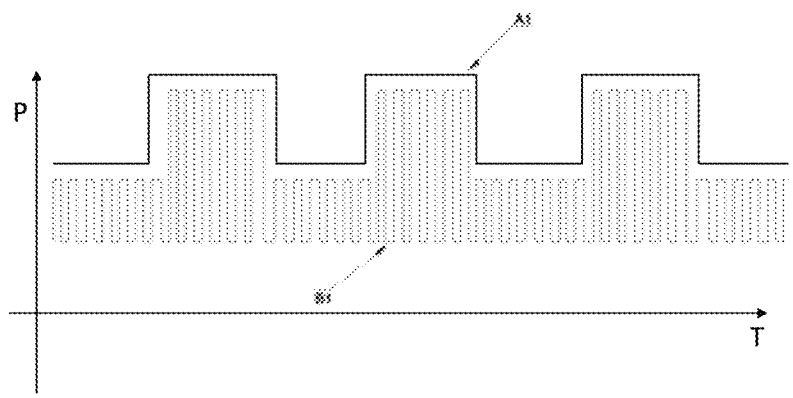
FIG. 4 is a schematic diagram of magnitude of optical power output by an optical module according to an embodiment of the disclosure.

FIG. 4 is a schematic diagram of magnitude of optical power output by an optical module according to an embodiment of the disclosure. As shown in FIG. 4, an optical module emits light with optical power adjusted with respect to time. The optical power is a summation of 2 channels of signals. Curve B1 represents a first signal carrying the first channel of information at the first frequency, as shown in FIG. 3, while curve A1 represents a second signal carrying a second channel of information at a second frequency smaller than the first frequency. As FIG. 4 shows, the amplitude of the optical power changes at the first frequency between a lower level and a higher level. The minimum optical power of the light is substantially consistent. However, the maximum optical power is not a constant. It changes between two levels at the second frequency smaller than the first frequency, following the contour A1. By sampling the optical power at the first frequency and second frequency, respectively, an analytical algorithm may extract the first channel of information and the second channel of information from the optical power output. In FIG. 4, both the first channel information and the second channel information are embedded in the optical power output as digital signals.

Figure 5:
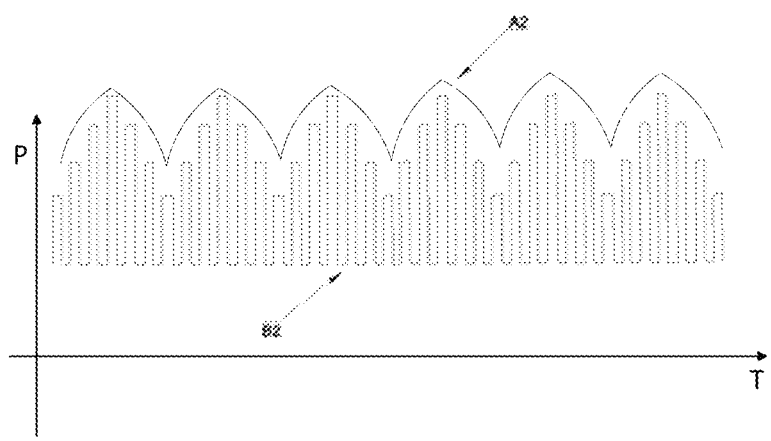
FIG. 5 is a schematic diagram of magnitude of optical power output by another optical module according to an embodiment of the disclosure.

The first channel information and the second channel information may also embedded in the optical power output as analog signals or a combination of digital and analog signals. For example, FIG. 5 is a schematic diagram of magnitude of optical power output combining a digital signal with an analog signal. The optical power is a summation of 2 channels of signals. Curve B2 represents a first signal (digital) carrying the first channel of information at the first frequency, as shown in FIG. 3, while curve A2 represents a second signal (analog) carrying a second channel of information. As FIG. 5 shows, the amplitude of the optical power changes at the first frequency between a lower level and a higher level. The minimum optical power of the light is substantially consistent. However, the maximum optical power is not a constant. It changes following the contour A2. By sampling the optical power at a frequency equal to or higher than the first frequency, an analytical algorithm may extract the first channel of information and the second channel of information from the optical power output.

International Organization for Standardization FSAN (Full Service Access Networks): proposes, when discussing NG-PON2 standard ITU-T G.989.2, that an "AMCC" (Auxiliary Management and Control Channel) function needs to be added in a "PTP WDM PON" (Point-to-Point Dense Wavelength Division Multiplexing Access Network). The AMCC function is mainly used for wavelength tuning and calibration, and OAM (Operation Administration and Maintenance) management.

How to add AMCC data into a service signal and implement receiving and sending of the AMCC data without affecting transmission and receiving of the service signal becomes an aching problem in the industry. This function needs to be implemented by the optical module. Currently, the conventional optical module can only carry a digital service signal, and does not have the function of carrying AMCC data. Therefore, creative improvements need to be made on the basis of the existing optical module, so as to provide a novel optical module that can meet new standard requirements.

A manner of implementing an AMCC function is that, a path of signal is added on a service channel established by the original optical signal, that is, a path of AMCC data is further added to the optical signal without affecting the transmission of the original optical signal. Between the transmitting end and the receiving end of the optical communication, the optical module of the transmitting end and the optical module of the receiving end establish a communication channel with a single-wavelength optical signal. Transmission of service data is implemented by using single-wavelength light, and in order to implement the AMCC function, a path of AMCC data needs to be added to the communication channel established by the single-wavelength optical signal. The service data and the AMCC data have a large rate difference, the transmission rate of the AMCC is about lower than 100K bit/s, and the rate of GPON service data is generally higher than 1 Gbps; therefore, the two paths of data may be distinguished by the rates.

A change frequency of high/low level of the current provided by the modulation circuit is 100 Kbit/s, and a change frequency of high/low level of the current provided by the second driver circuit is 12.5 Gbps.

The embodiments of the present disclosure provide an optical module, and on the basis of the optical module, a change frequency of the current provided by the modulation circuit to the light emitting region is less than 1 Gbps, and a change frequency of the current provided by the second driver circuit to the modulation region is greater than 1 Gbps, which may be 12.5 Gbps.

Figure 6:
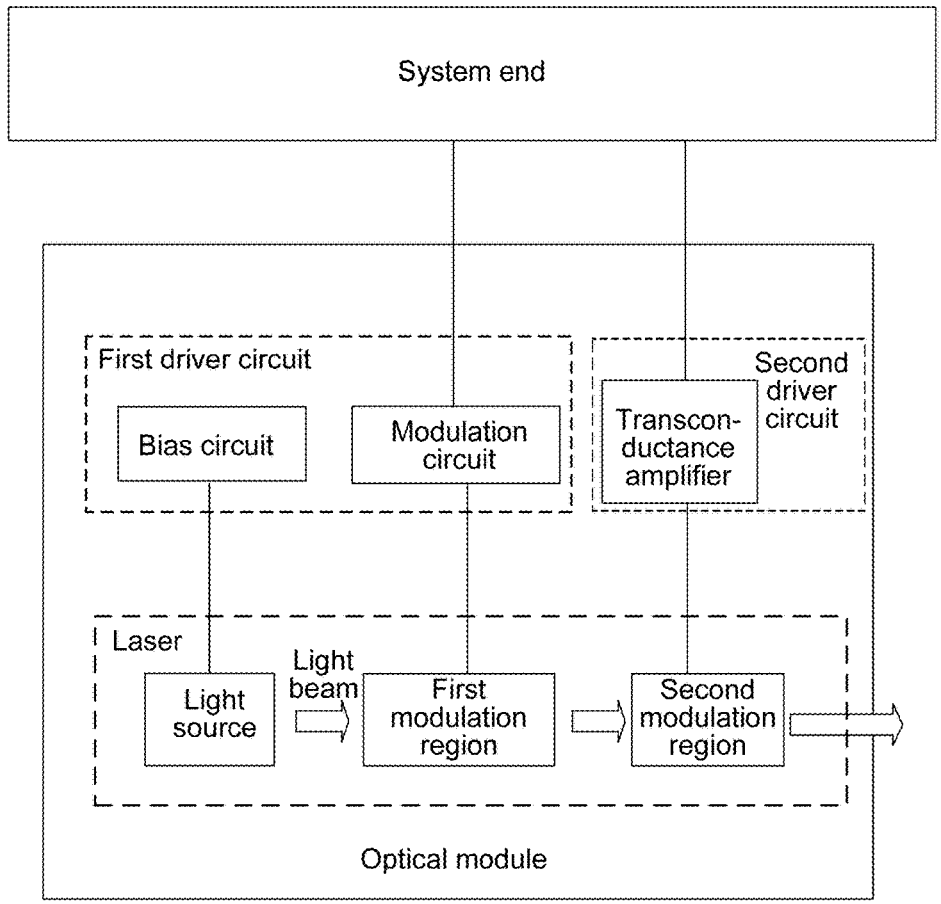
FIG. 6 is a schematic structural diagram of an optical module according to an embodiment of the disclosure.

In another embodiment, the laser may have, as shown in FIG. 6, a light source, a first modulation region, and a second modulation region. The light source and the first modulation region may receive power or control signal from the first drive circuit. For example, the light source may receive power or control signal from the bias circuit in the first drive circuit, and the first modulation region may receive power or control signal from the modulation circuit in the first drive circuit. Here the power from either the bias circuit or the modulation circuit may be in the form of current or voltage. The control signal from either the bias circuit or the modulation circuit may be in the form of current or voltage. The first driver circuit may communicate with a system end, and the second driver circuit may communicate with the system end. For example, the system end may communicate with the modulation circuit in the first driver circuit. Furthermore, the second driver circuit may include a transconductance amplifier connected between the system end and the second modulation region. The light source emits a light beam and delivers the light beam into the first modulation region. The first modulation region may receive the light beam from the light source, modulate the light beam, and deliver the light beam to the second modulation region.

In an exemplary embodiment in FIG. 6, the light source, the first modulation region and the second modulation region are current control devices. The bias circuit may output a current signal with adjustable amplitude to the light source. The modulation circuit may output a current signal with adjustable amplitude to the first modulation region. The second driver circuit may output a current signal with adjustable amplitude to the second modulation region. For example, the bias circuit provides a current with a pre-set amplitude to the light source, so that the light source emits a light beam with stable optical power. The modulation circuit provides a current with changing amplitude to the first modulation region, so that the first modulation region modulates the light beam and delivers the light beam with changing optical power to the second modulation region. The second driver circuit provides a current with changing amplitude to the second modulation region, so that the second modulation region further modulates the light beam and delivers the light beam.

In one exemplary embodiment, a change frequency of the current provided by the modulation circuit to a first modulation region may be a lower frequency of more than one frequencies. A change frequency of the current provided by the second driver circuit to the second modulation region may be a higher frequency of the more than one frequencies. For example, when there are two frequencies (100 Kbit/s and 12.5 Gbps), the change frequency of the current provided by the modulation circuit to a first modulation region may be less than 1 Gbps, which is 100 Kbit/s; and the change frequency of the current provided by the second driver circuit to the second modulation region may be greater than 1 Gbps, which is 12.5 Gbps.

Furthermore, in another exemplary embodiment, a change frequency of the current provided by the modulation circuit to a first modulation region may be a higher frequency of more than one frequencies. A change frequency of the current provided by the second driver circuit to the second modulation region may be a lower frequency of the more than one frequencies. For example, when there are two frequencies (100 Kbit/s and 12.5 Gbps), the change frequency of the current provided by the modulation circuit to a first modulation region may be greater than 1 Gbps, which is 12.5 Gbps; and the change frequency of the current provided by the second driver circuit to the second modulation region may be smaller than 1 Gbps, which is 100 Kbit/s.

At the receiving end, the optical module receives the light from the transmitting end, converts the light with adjustable optical power into an electrical signal with adjustable current value by using a photoelectric effect, and processes the electrical signal to obtain transmitted information.

Apparently, persons skilled in the art can made various changes and variations on the disclosure without departing from the spirit and scope of the disclosure. In this way, if the modifications and variations of the disclosure are incorporated in the scope of the claims of the disclosure and equivalent techniques, the disclosure is also intended to incorporate the modifications and variations.

What is claimed is:

1. An optical module, comprising:
   a laser comprising a light source, a first modulation region, and a second modulation region, wherein:
   the light source is configured to emit a light beam,
   the first modulation region is configured to receive the light beam from the light source, modulate an optical power of the light beam and deliver the light beam to the second modulation region, and
   the second modulation region is configured to receive the light beam from the first modulation region, modulate the optical power of the light beam from the first modulation region, and deliver the light beam;
   a first driver circuit comprising a modulation circuit, wherein:
   the modulation circuit is connected to the first modulation region, and
   the modulation circuit is configured to drive the first modulation region according to a first amplitude-adjusting signal from a system end; and
   a second driver circuit connected to the second modulation region, wherein:
   the second driver circuit is configured to drive the second modulation region according to a second amplitude-adjusting signal from the system end.

2. The optical module according to claim 1, wherein:
   the modulation circuit is configured to adjust the optical power of the light beam by driving the first modulation region.

3. The optical module according to claim 2, wherein:
   the first driver circuit further comprises a bias circuit connected to the light source, wherein the bias circuit is configured to drive the light source to emit the light beam with a stable optical power.

4. The optical module according to claim 3, wherein:
   the second driver circuit is configured to control the second modulation region to adjust the optical power of the light beam by driving the second modulation region.

5. An optical module comprising:
   a laser comprising a light source, a first modulation region, and a second modulation region, wherein:
   the light source is configured to emit a light beam,
   the first modulation region is configured to receive the light beam from the light source, modulate an optical power of the light beam and deliver the light beam to the second modulation region, and
   the second modulation region is configured to receive the light beam from the first modulation region, modulate the optical power of the light beam from the first modulation region, and deliver the light beam;
   a first driver circuit comprising a modulation circuit and a bias circuit, wherein:
   the modulation circuit is connected to the first modulation region,
   the modulation circuit is configured to drive the first modulation region to adjust the optical power of the light beam according to a first amplitude-adjusting signal from a system end, and
   the bias circuit is connected to the light source and configured to drive the light source to emit the light beam with a stable optical power; and
   a second driver circuit connected to the second modulation region and configured to control the second modulation region to adjust the optical power of the light beam by driving the second modulation region, wherein:
   the second driver circuit is configured to drive the second modulation region according to a second amplitude-adjusting signal from the system end.

6. The optical module according to claim 5, wherein:
   a frequency of the first amplitude-adjusting signal is lower than a frequency of the second amplitude-adjusting signal.

7. The optical module according to claim 6, wherein the system end is an electronic controlling device externally connected to the optical module.

8. The optical module according to claim 6, wherein the second driver circuit comprises a transconductance amplifier connected between the system end and the second modulation region.

9. The optical module according to claim 6, wherein
   the bias circuit outputs a current signal with adjustable amplitude to the light source;
   the modulation circuit outputs a current signal with adjustable amplitude to the first modulation region; and the second driver circuit outputs a current signal with adjustable amplitude to the second modulation region.

10. The optical module according to claim 9, wherein:
the frequency of the first amplitude-adjusting signal is lower than 1 Gbps; and
the frequency of the second amplitude-adjusting signal is higher than 1 Gbps.

11. The optical module according to claim 5, wherein
the first amplitude-adjusting signal is a voltage signal or a current signal; and
the second amplitude-adjusting signal is a voltage signal or a current signal.

12. The optical module according to claim 11, wherein
the bias circuit outputs a current signal with adjustable amplitude to the light source;
the modulation circuit outputs a current signal with adjustable amplitude to the first modulation region; and
the second driver circuit outputs a current signal with adjustable amplitude to the second modulation region.

* * * * *